(12) United States Patent
Fifield et al.

(10) Patent No.: US 10,699,771 B2
(45) Date of Patent: Jun. 30, 2020

(54) VOLTAGE BOOST CIRCUIT

(71) Applicant: INTERNATIONAL BUSINESS MACHINES CORPORATION, Armonk, NY (US)

(72) Inventors: John A. Fifield, Underhill, VT (US); Dale E. Pontius, Colchester, VT (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/507,710

(22) Filed: Jul. 10, 2019

(65) Prior Publication Data
US 2019/0333568 A1 Oct. 31, 2019

Related U.S. Application Data

(63) Continuation of application No. 16/058,491, filed on Aug. 8, 2018, now Pat. No. 10,438,652, which is a continuation of application No. 15/465,045, filed on Mar. 21, 2017, now Pat. No. 10,127,970, which is a continuation of application No. 14/327,915, filed on Jul. 10, 2014, now Pat. No. 9,634,557.

(51) Int. Cl.
*H02M 3/07* (2006.01)
*G11C 11/408* (2006.01)
*G11C 11/4074* (2006.01)
*H02M 3/158* (2006.01)

(52) U.S. Cl.
CPC ...... *G11C 11/4085* (2013.01); *G11C 11/4074* (2013.01); *H02M 3/07* (2013.01); *H05K 999/99* (2013.01); *H02M 3/158* (2013.01)

(58) Field of Classification Search
CPC .. H02M 3/07; H02M 3/158; H02M 2003/158; G05F 1/46; G05F 1/462; G11C 11/408; G11C 11/4085; H05K 999/99
See application file for complete search history.

(56) References Cited

U.S. PATENT DOCUMENTS

| | | |
|---|---|---|
| 4,398,100 A | 8/1983 | Tobita et al. |
| 7,095,268 B2 | 8/2006 | Pappalardo et al. |
| 7,102,423 B2 | 9/2006 | Lee et al. |
| 7,233,194 B2* | 6/2007 | Du .................... H02M 3/073 327/536 |
| 7,276,958 B2 | 10/2007 | Miyamitsu et al. |
| 7,372,319 B1 | 5/2008 | Lee |
| 7,724,070 B2 | 5/2010 | Fukami |
| 7,737,766 B2 | 6/2010 | Dreibelbis et al. |

(Continued)

OTHER PUBLICATIONS

List of IBM Patents or Patent Applications Treated as Related, 1 page, Jul. 10, 2019.

*Primary Examiner* — Matthew V Nguyen
(74) *Attorney, Agent, or Firm* — Steven Meyers; Andrew M. Calderon; Roberts Calderon Safran & Cole, P.C.

(57) ABSTRACT

A voltage boost circuit for eDram using thin oxide field effect transistors (FETs) is disclosed. The voltage boost circuit includes a boost capacitor which is precharged with a precharge voltage in a precharge stage and which provides a boosted supply voltage to a thin oxide FET during a pump phase. The voltage boost circuit further include a drive capacitor which provides a turn on voltage to the thin oxide FET so that the boosted supply voltage can pass to an output node in the pump phase.

10 Claims, 7 Drawing Sheets

(56) References Cited

U.S. PATENT DOCUMENTS

| | | | |
|---|---|---|---|
| 7,924,633 B2* | 4/2011 | Behrends | G11C 11/413 |
| | | | 365/185.23 |
| 8,203,857 B2 | 6/2012 | Ohshima et al. | |
| 8,513,932 B2 | 8/2013 | Yang | |
| 9,634,557 B2 | 4/2017 | Fifield et al. | |
| 10,127,970 B2 | 11/2018 | Fifield et al. | |
| 2006/0152273 A1 | 7/2006 | Pappalardo et al. | |
| 2006/0164154 A1 | 7/2006 | Fukami | |
| 2009/0206917 A1 | 8/2009 | Dreibelbis et al. | |
| 2013/0214851 A1* | 8/2013 | Fifield | H02M 3/07 |
| | | | 327/536 |
| 2014/0055170 A1 | 2/2014 | Liang | |
| 2015/0311794 A1 | 10/2015 | Khayat et al. | |
| 2016/0013718 A1 | 1/2016 | Fifield et al. | |
| 2017/0194044 A1 | 7/2017 | Fifield et al. | |
| 2017/0270999 A1* | 9/2017 | Hunt-Schroeder | |
| | | | G11C 11/419 |
| 2018/0350424 A1 | 12/2018 | Fifield et al. | |

* cited by examiner

VOLTAGE BOOST CIRCUIT

FIELD OF THE INVENTION

The invention relates to semiconductor structures and, more particularly, to a voltage boost circuit for eDram using thin oxide field effect transistors (FETs).

BACKGROUND

A voltage boost circuit or charge pump is an electronic circuit that uses capacitors for energy storage to create a higher voltage power source. By way of one implementation, voltage boost circuits are needed for eDram's boosted word line VPP, and negative word line off voltage, VWL.

A challenge with charge pumps is that when creating a higher voltage power source, e.g., two or three times a supply voltage, voltages may be generated in excess of the oxide-stress limit of a field effect transistor (FET), i.e., a stress limit of the gate oxide thickness. That is, node voltages within a voltage boost circuit can exceed the reliability limits of maximum Vdd voltage. This may cause a failure of the charge pump and hence fail to provide the required voltage boost.

To overcome these reliability issues, FET devices are designed to have an oxide stress limit greater than the output voltage of the pumping system. Such a design requires a thick oxide which results in a low performance device. For example, these low performance thick-oxide FETs have a Vt of about 500 mv at worst case, and low voltage pump operation is poor and limited to about 750 mv. Thick-oxide FETs also use VPP-boosted phases which must be distributed to all pump banks and burn $C(VPP)^2$ power. Vds stresses can also be remedied by stacking FETs to share the high differential voltage; however, this is expensive and requires a large amount of chip space.

SUMMARY

In an aspect of the invention, a voltage boost circuit comprises a boost capacitor which is precharged with a precharge voltage in a precharge stage and which provides a boosted supply voltage to a thin oxide FET during a pump phase. The voltage boost circuit further comprises a drive capacitor which provides a turn on voltage to the thin oxide FET so that the boosted supply voltage can pass to an output node in the pump phase.

In an aspect of the invention, a voltage boost circuit comprises a boost capacitor, a drive capacitor and a thin oxide FET. The boost capacitor and the drive capacitor have a precharge voltage provided in a precharge phase. In a pump phase, a power supply voltage is added to the precharge voltage of the boost capacitor to obtain a boosted output voltage passed through the thin oxide FET to an output node when the thin oxide FET is turned on by the precharge voltage of the drive capacitor applied at a gate node of the thin oxide FET.

In an aspect of the invention, a method comprises: precharging a first capacitor and a second capacitor with a precharge voltage during a precharge phase; boosting the precharge voltage of the first capacitor to a boosted output voltage during a pump phase; turning on a thin oxide FET by providing the precharge voltage of the second capacitor to a gate node of the thin oxide FET; and passing the boosted output voltage through the thin oxide FET to an output node when the thin oxide FET is turned on.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the voltage boost circuit, which comprises the structures of the present invention. In still further embodiments, a method in a computer-aided design system is provided for generating a functional design model of the voltage boost circuit. The method comprises generating a functional representation of the structural elements of the voltage boost circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a voltage boost circuit for eDram using thin oxide field effect transistors (FETs). Advantageously, for example, gate bias circuits of the voltage boost circuit are designed to have a function of a boosted internal voltage to provide a gate level to safely turn on a thin-oxide PFET. That is, the present invention provides a structure and method of developing a FET on-gate voltage which is controlled to a level less than the reliability limit set by the maximum power supply voltage.

More specifically, the present invention is directed to a voltage boost circuit wherein a 2-terminal capacitor is charged to a power supply level in a precharge phase, and both terminals of the capacitor are disconnected from the power supply level in a pump phase and connected to a gate and source of an output FET to limit the gate-to-source oxide stress to a voltage determined by the power supply level. In implementation, the capacitor can be precharged to Vdd, and both terminals can be switched across Vgs of the output FET to provide an on-voltage Vgs of Vdd, or less. Reliability limits are thus set to the Vdd supply voltage.

The voltage boost circuit of the present invention can be manufactured in a number of ways using a number of different tools. In general, though, the methodologies and tools are used to form structures with dimensions in the micrometer and nanometer scale. The methodologies, i.e., technologies, employed to manufacture the voltage boost circuit of the present invention have been adopted from integrated circuit (IC) technology. For example, the structures of the present invention are built on wafers and are realized in films of material patterned by photolithographic processes on the top of a wafer. In particular, the fabrication of the voltage boost circuit of the present invention uses three basic building blocks: (i) deposition of thin films of material on a substrate, (ii) applying a patterned mask on top of the films by photolithographic imaging, and (iii) etching the films selectively to the mask.

Figure 1:
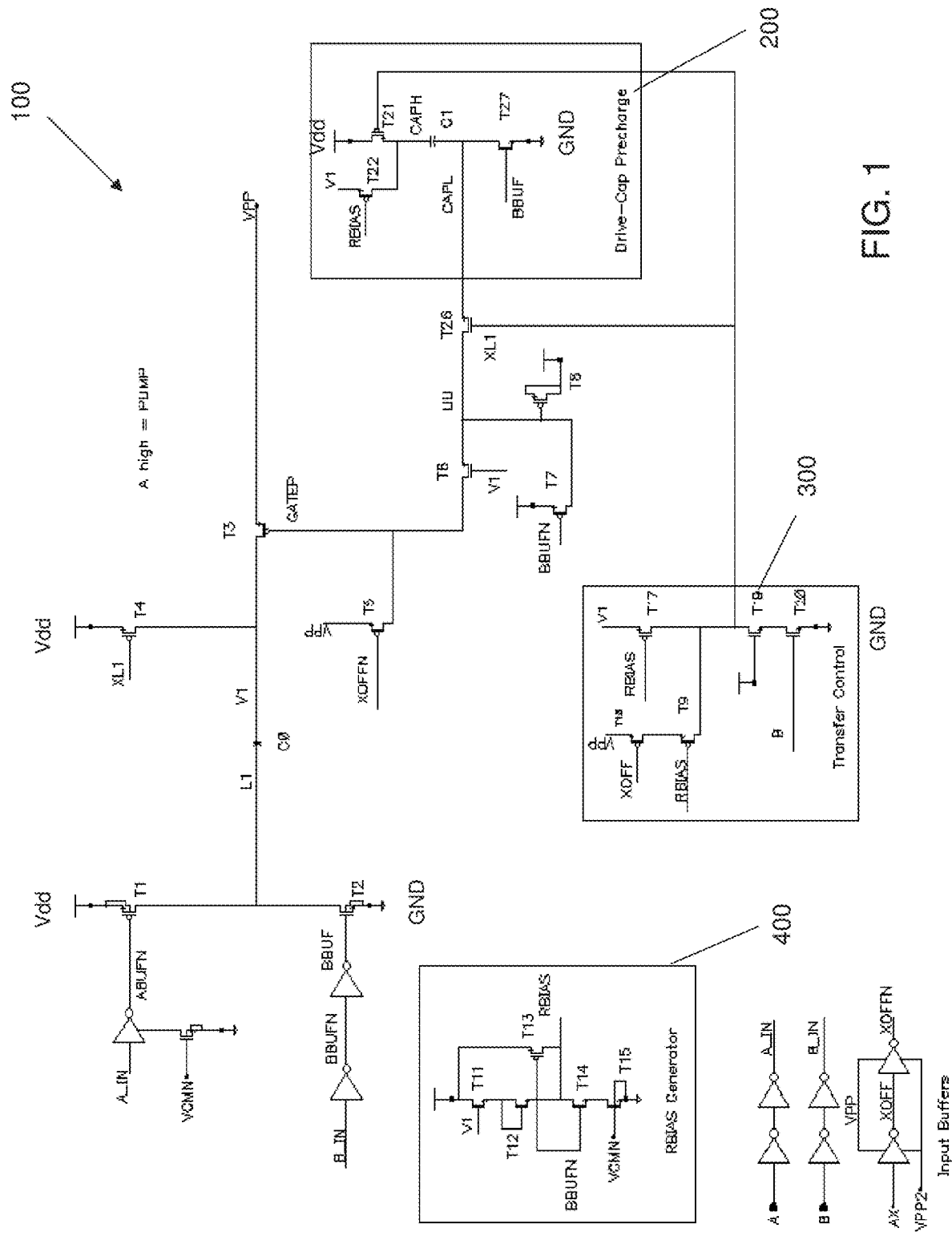
FIG. 1 shows a schematic diagram of a voltage boost circuit in accordance with aspects of the present invention.

FIG. 1 shows a schematic diagram of a voltage boost circuit in accordance with aspects of the present invention. In embodiments, the voltage boost circuit 100 is a two stage voltage pump circuit that generates an output, boosted voltage on output node VPP. By way of example, the two stages of the voltage boost circuit 100 include a precharge phase and a boost/pump phase. In the precharge phase of the voltage boost circuit 100, capacitor C0 and capacitor C1 will be precharged to Vdd; whereas, in the boost/pump phase, the precharged voltage of capacitor C0 will be added to Vdd (and the precharged voltage of capacitor C1 will be provided as a gate voltage GATEP (to open a FET T3 and reduce the voltage difference between the source and drain) in order to boost the output voltage at output node VPP.

In embodiments, the boosted voltage on output node VPP is approximately 2× a supply voltage, Vdd. For example, an output boosted voltage of approximately 2.0 V at node VPP can be obtained with a supply voltage Vdd of approximately 1V. In contrast to conventional voltage boost circuits, the voltage boost circuit 100 of the present invention can provide the boosted voltage output voltage using lower voltage limit FETs, e.g., thin gate oxide FETs, without sacrificing reliability and performance. For example, the voltage boost circuit 100 may use an approximately 10-Angstrom gate oxide thickness FET (T3) that can only withstand a gate oxide stress voltage of approximately 1.0 V. In more specific embodiments, the voltage boost circuit 100 comprises the following thin oxide, high performance FETs with exemplary gate widths: (i) T1=15µ; (ii) T2, T3=10µ; (iii) T4=15µ; (iv) T5, T8, T9, T10, T15=2µ; (v) T6, T14, T19, T20, T22, T26=1µ; (vi) T7, T11, T12, T13, T21, T27=640 nm; and (vii) T17=4µ. In embodiments, FETs T1-T4 are connected to output node VPP.

In embodiments, the precharge phase of the voltage boost circuit 100 will precharge the capacitor C0 to Vdd, e.g., 1 V. The precharging phase can be performed by turning on FETs T4 and T2. In this way, FET T4 can precharge the capacitor C0 to Vdd, e.g., 1 V, while FET T2 can connect node L1 to 0 V. In the boost/pump phase, FETs T4 and T2 are turned off, and FET T1 is turned on. This will lift node L1 to Vdd, e.g., 1 V, so that it can be added to the voltage Vdd of the precharged capacitor C0. This, in turn, will bring the voltage at node V1 to 2× supply voltage, e.g., 2 V. The boosted voltage can then be passed through FET T3 to output node VPP.

As to not overstress FET T3, e.g., exceed its oxide reliability (Vdd in this example), FET T3 remains turned off until output gate voltage at node GATEP can be appropriately charged by drive-cap precharge circuit 200 (during the boost phase). That is, the drive-cap precharge circuit 200 will generate a gate voltage at node GATEP (e.g., V1−Vdd) which, in turn, can be applied across the gate and source of FET T3. As should be understood by those of skill in the art, not only will the gate voltage of node GATEP turn on the FET T3, it will also provide an on-voltage across the FET T3 which is below its reliability limit, e.g., the voltage difference between the source and drain of FET T3 will not exceed the reliability limit of FET T3 (e.g., V1−Vdd). By turning on FET T3 with the gate voltage of node GATEP, the 2× supply voltage, e.g., 2 V, at node V1 can pass through FET T3 to the output node VPP.

Referring to the control of the drive-cap precharge circuit 200, during the precharge phase, capacitor C1 can be precharged to Vdd (e.g., 1 V) by two activation signals: (i) a high input clock signal B makes XL1 node low to turn on FET T21; and (ii) a high input clock signal BBUF to turn on FET T27 and bring CAPL to GND (e.g., 0 V). In the precharge phase, XOFFN will also restore node GATEP to a high voltage, VPP, by turning on FET T5, thus ensuring that FET T3 remains turned off (e.g., is not overstressed) until the boost/pump phase. Also, in the precharge phase, capacitors C0 and C1 will have the same voltage, e.g., 1 V.

After the precharge phase (e.g., during the boost/pump phase), FETs T2, T4, T5, T21 are turned off and Vdd (1 V) of capacitor C1 is supplied to node GATEP of FET T3 as a gate voltage (V1−Vdd). In more specific embodiments, due to parasitic capacitance, the gate voltage at node GATEP is (V1−Vdd)/C1/(C1+Cp)), where Cp is a parasitic capacitance. As described in more detail herein, gate voltage is provided at node GATEP by turning on isolation FETs T6 and T26. As noted herein, the gate voltage, e.g., V1−Vdd, turns on FET T3, while also ensuring that FET T3 will not exceed its reliability limit, e.g., be overstressed. That is, the gate voltage of node GATEP will lower the voltage of node V1 to within acceptable limits for a thin oxide device. It should thus be understood that FETs T5, T6 and T26 can control the output gate voltage of node GATEP, and pass an on-gate voltage equal to or less than V1−Vdd to FET T3. Accordingly, in this way, the drive-cap precharge circuit 200 will ensure that the voltage across FET T3 will always be less than the reliability limit.

In embodiments, the transfer control circuit 300 provides a restore signal XL1 to the drive-cap precharge circuit 200, e.g., FET T21, and FET T26. For example, XL1 can provide control for connecting the CAPH and CAPL terminals to Vdd and GND, respectively, in the precharge phase when BBUF is high and XL1 is at GND (low). More specifically, during the precharge phase, a high input clock signal B will be inverted through FETs T19 and T25, resulting in a low XLI signal. The low XLI signal will turn on FET T5. This low XLI signal will also turn off (control) FET T26. In contrast, during the boost/pump phase, input signal B is low, which turns off the FETs T27 and T21, allowing the nodes of C1 to float. Also, during the boost/pump phase, a high V1 signal passes through FET T17 and turns on FET T26, allowing conduction between CAPL and GATEP, e.g., passing the precharge voltage of C1 to node GATEP of FET T3.

In embodiments, RBIAS generator circuit 400 can tailor the current of RBIAS during the precharge phase and boost/pump phase to provide a functional transfer of signal XL1 to the drive-cap precharge circuit 200, allowing CAPL to connect to the GATEP node of FET T3 during, e.g., the boost/pump phase. In embodiments, the RBIAS generator circuit 400 will also generate an RBIAS signal to control FET T17 (of the transfer control circuit 300) which, in turn, provides the high V1 signal to turn off the FET T3. In embodiments, the RBIAS is a function of VCMN, e.g., a bandgap voltage reference, and is preferably at a voltage level between Vdd and GND. For example, in embodiments, the RBIAS generator circuit 400 produces a bias voltage of about 2-Vt below the boosted node voltage V1. In embodiments, RBIAS voltage level is high when the input voltage V1 rises. The RBIAS voltage will also rise close to power supply, Vdd when input BBUF is low.

Figure 2:
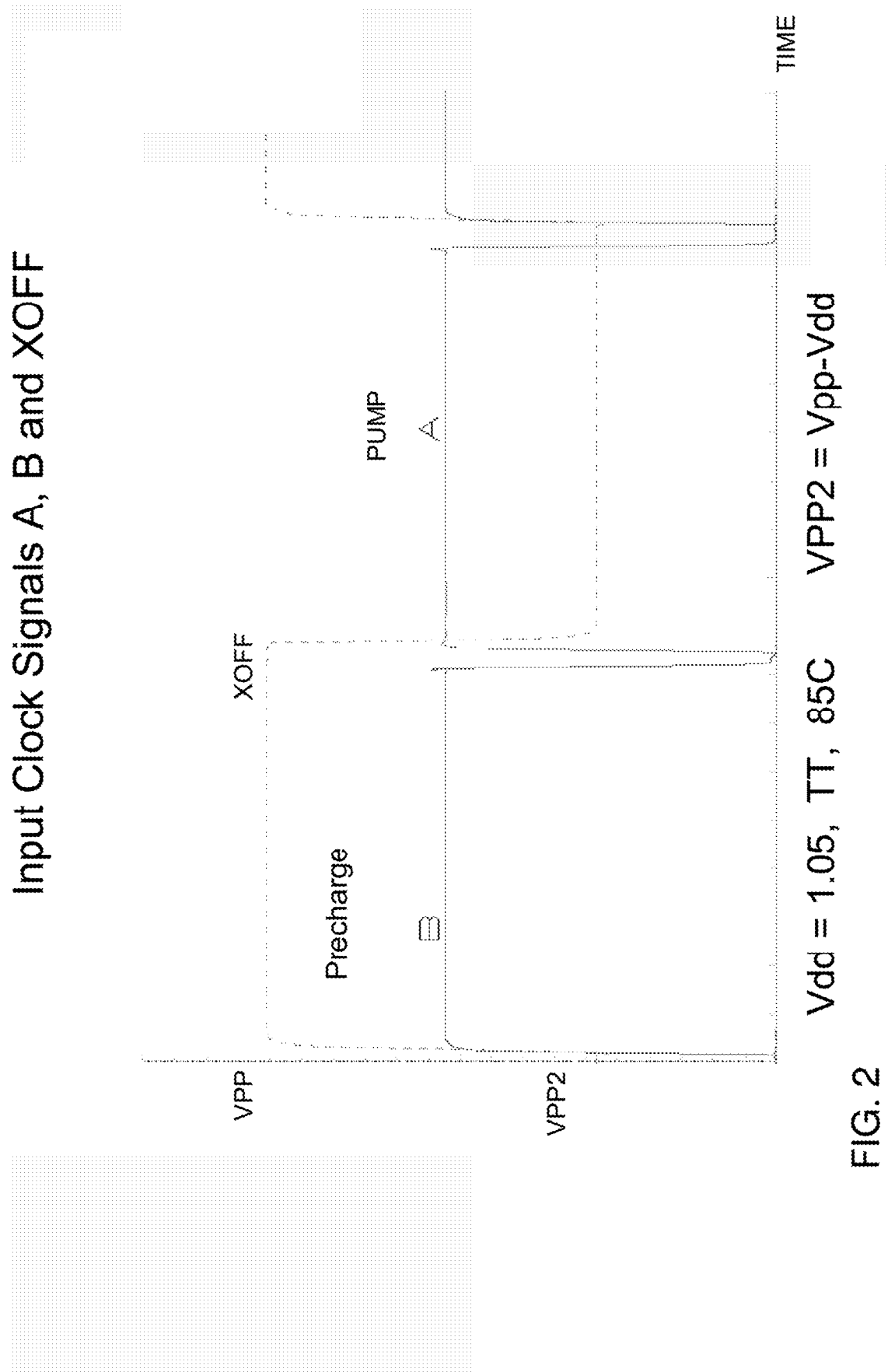
FIG. 2 shows input timing clocks using the voltage boost circuit in accordance with aspects of the present invention.

FIG. 2 shows input timing clocks using the voltage boost circuit of FIG. 1, in accordance with aspects of the present invention. In embodiments, the voltage boost circuit is run by 2-non-overlapping phases A and B, and a translated version of A which cycles between VPP and VPP2. Voltage VPP2 is a regulated voltage chosen to be approximately VPP−Vdd_max, where Vdd_max is the highest Vdd allowed by the limitations of gate-oxide and other technology related limits. Input VCMN is a current mirror voltage which produces a 15 μa current through a 1μ/480 nm device in this example.

Figure 3:
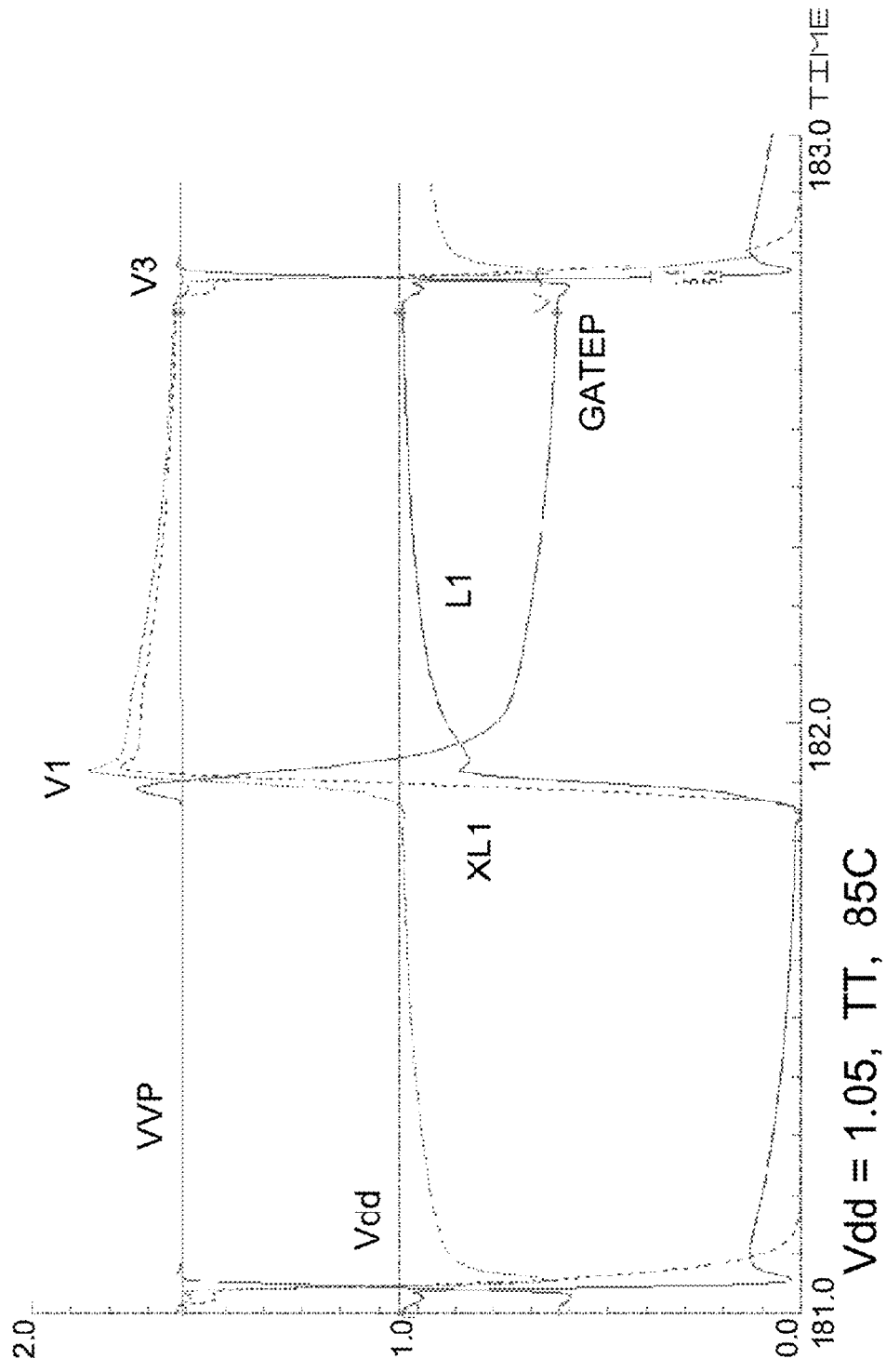
FIG. 3 shows a basic operation of the voltage boost circuit in accordance with aspects of the present invention.

FIG. 3 shows a basic operation of the voltage boost circuit of FIG. 1, in accordance with aspects of the present invention. In the example of FIG. 3, the output voltage VPP is regulated to 1.6V and Vdd is at its maximum of 1.05V. In the precharge time frame from 181 to 182, nodes L1 and V1 of capacitor C0 are restored to GND and Vdd, respectively, GATEP is at VPP, and transfer gate signal XL1 is at GND. Immediately prior to time 182, the A phase is activated and restore phase for signal XL1 rises and is coupled to node V1 to hold-off (turn-off) FET T4. Node L1 is lifted to Vdd slowly by discharge of ABUFN through VCMN current source, which causes node V1 to rise toward 2× Vdd. The gate of output FET T3, i.e., gate voltage GATEP, is driven to (V1−Vdd*n), where n is an efficiency factor less than 1 and defined by the ratio of GATEP node capacitance and the drive capacitance C1. Charge from boost capacitor C0 is transferred into output node VPP.

Figure 4:
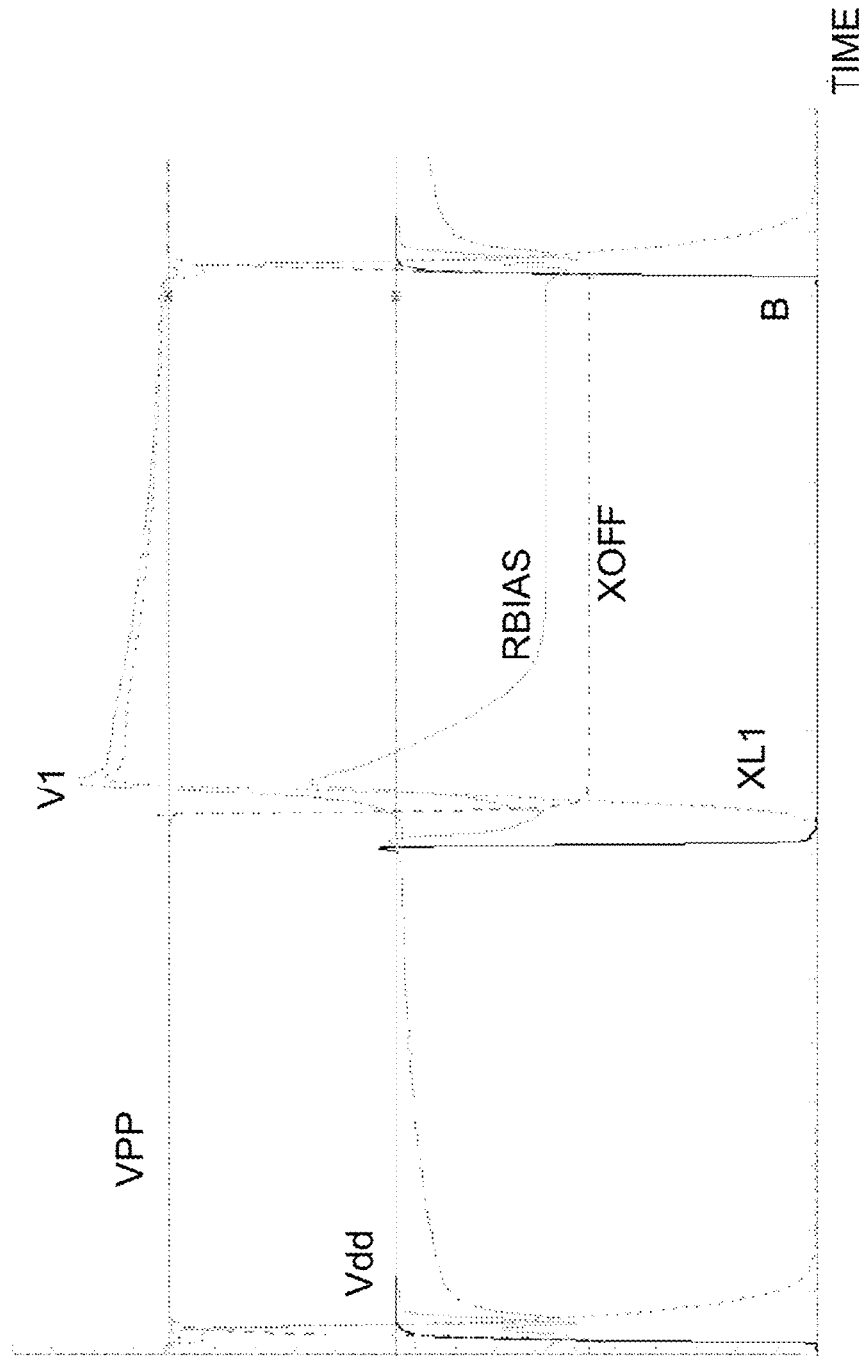
FIG. 4 shows generation of a restore phase with signal XL1 in accordance with aspects of the present invention.

FIG. 4 shows generation of a restore phase XL1 in accordance with aspects of the present invention. As shown in FIG. 4, the restore phase of signal XL1 is generated by the transfer control circuit 300 in FIG. 1. An input to the transfer control circuit 300 is bias voltage RBIAS which is intended to turn on PFET T17 connected to node V1 at a safe gate-voltage limit. The RBIAS generator circuit 400 of FIG. 1 restores node RBIAS to Vdd in the precharge phase when conduction from boosted node V1 is cut off. In the pump phase, inputs A and BBUFN are high and a predetermined current is drawn through T11 and T12 through current source of FET T15. Voltage RBIAS is thereby dropped to a voltage close to V1−2*Vt, which is sufficient to turn on a PFET (e.g., FET T17) with its source at node V1. In the precharge phase, both nodes V1 and RBIAS are at Vdd so FET T17 of the transfer control circuit 300 of FIG. 1 is off. Input XOFF is at VPP, so FET T18 of FIG. 1 is also off. Input B is high so node XL1 is discharged to GND through stacked isolation FET T19 of FIG. 1. Node XL1 is used to turn on precharge device PFET T4, and turn off isolation NFET T26.

Figure 5:
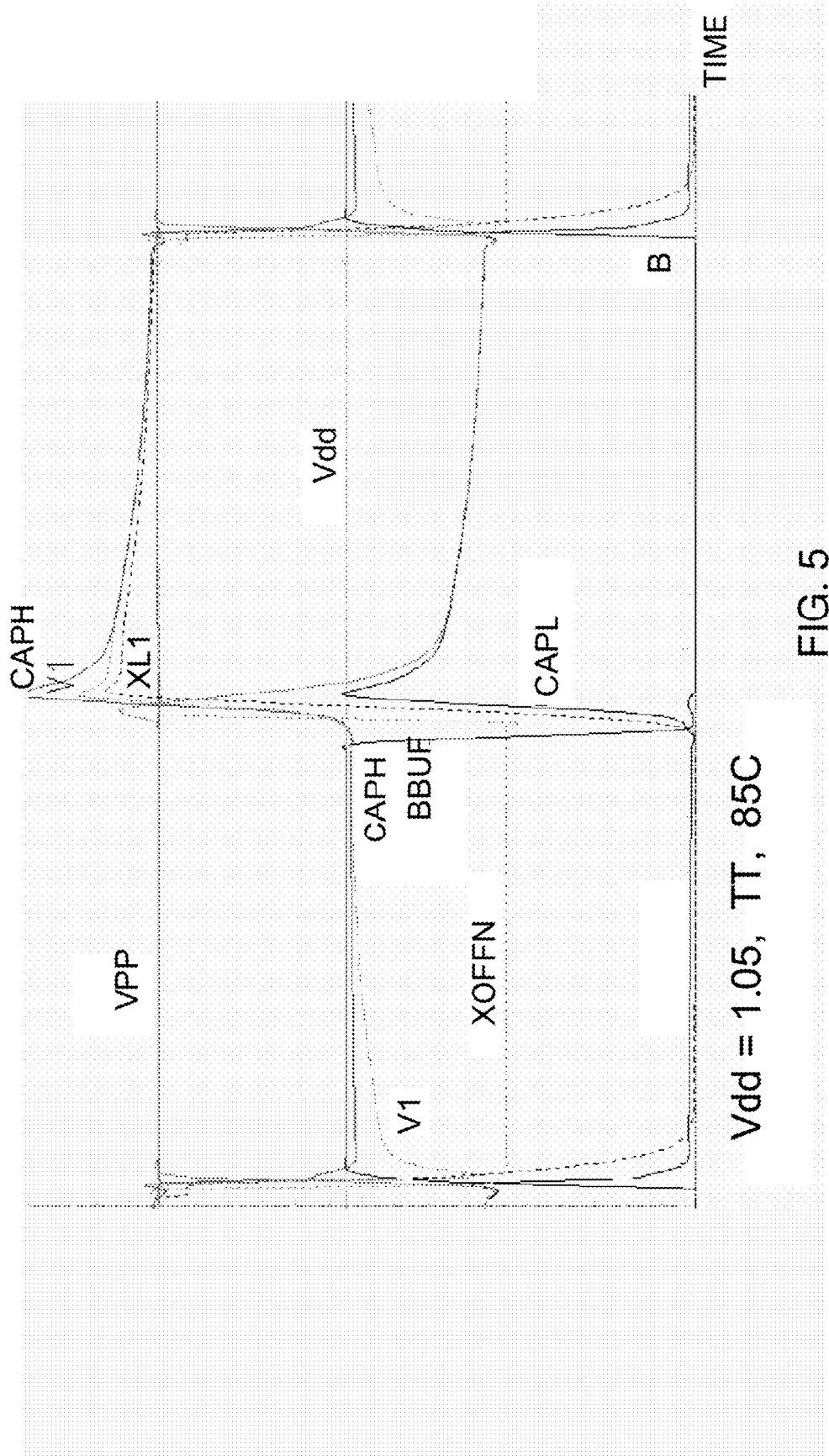
FIG. 5 shows a charge up and transfer of Vdd to a transistor gate (GATEP) of the voltage boost circuit shown in FIG. 1, in accordance with aspects of the present invention

FIG. 5 shows a charge up and transfer of Vdd to GATEP of the voltage pump shown in FIG. 1, in accordance with aspects of the present invention. In accordance with FIG. 5, the drive-cap precharge circuit 200 shown in FIG. 1 connects CAPH and CAPL terminals to Vdd and GND, respectively, in the precharge phase when BBUF is high, and signal XL1 is at GND. XOFFN is low at VPP2 level which turns on FET T5 and holds node GATEP at VPP level to cut off output FET T3. In the pump phase, input B and buffered node BBUF go low which releases node XL1. XOFFN goes high to VPP which cuts off restore FET T5, and XOFF going low turns on FET T13 and allows restore phase XL1 to rise to VPP level. The VPP level flows through stack device PFET T9 which is held on with gate voltage RBIAS. Restore phase XL1 is driven towards level VPP initially and then when boosted node V1 rises above VPP, conduction through T17 drives XL1 to V1 level. Any V1 conduction back through FET T13 to VPP aides transfer of boosted charge to VPP by output FET T3. With boosted level V1 high, and precharge phase XL1 at boosted level V1, FET T17 is off and capacitor C1 terminal CAPH rises to V1 level from conduction through T22. Terminal CAPL rises with CAPH to a level Vdd below V1. NFET T26 turns on and couples terminal CAPL to GATEP through stack FET T6.

Charge sharing from the node GATEP net will guarantee that stress on output FET T3 will be less than Vdd. In other words, the source of FET T3 is at V1 potential and the gate is at a potential (V1−Vdd*n), where n is the capacitance ratio between node GATEP and the capacitance of C1. This gate drive is sufficient to transfer charge from boosted node V1 to output node of FET T3 and is below the maximum Vgs defined by the level of maximum Vdd.

Figure 6:
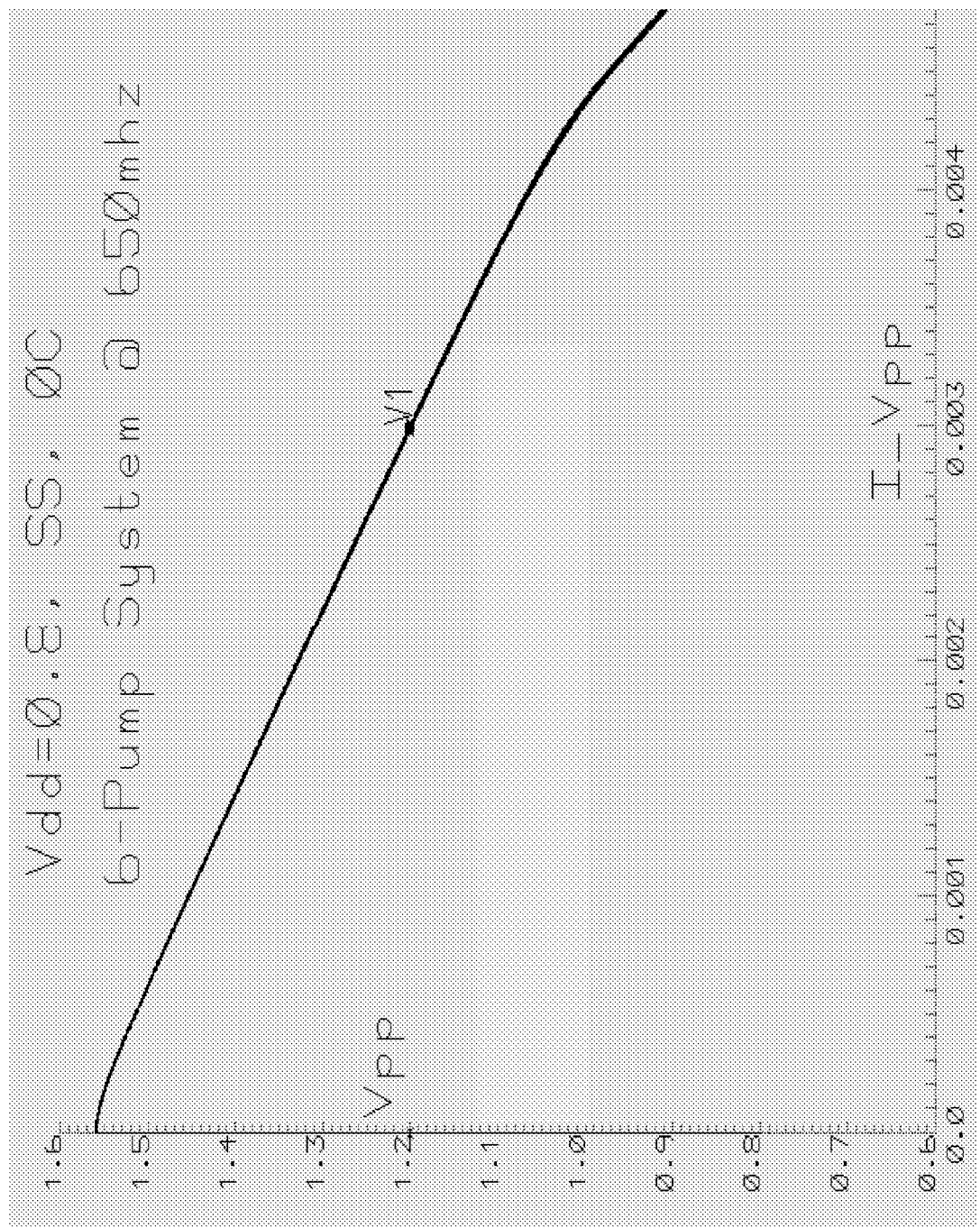
FIG. 6 shows IV characteristics of a 6-pump system in accordance with aspects of the present invention.

FIG. 6 shows IV characteristics of a 6-pump system in accordance with aspects of the present invention. More specifically, FIG. 6 shows an exemplary VPP system of 6-pumps clocked with dual clocks 180 degrees apart by a 650-mhz oscillator. Output current I_VPP at 1.2 volts is about 3 μa.

Figure 7:
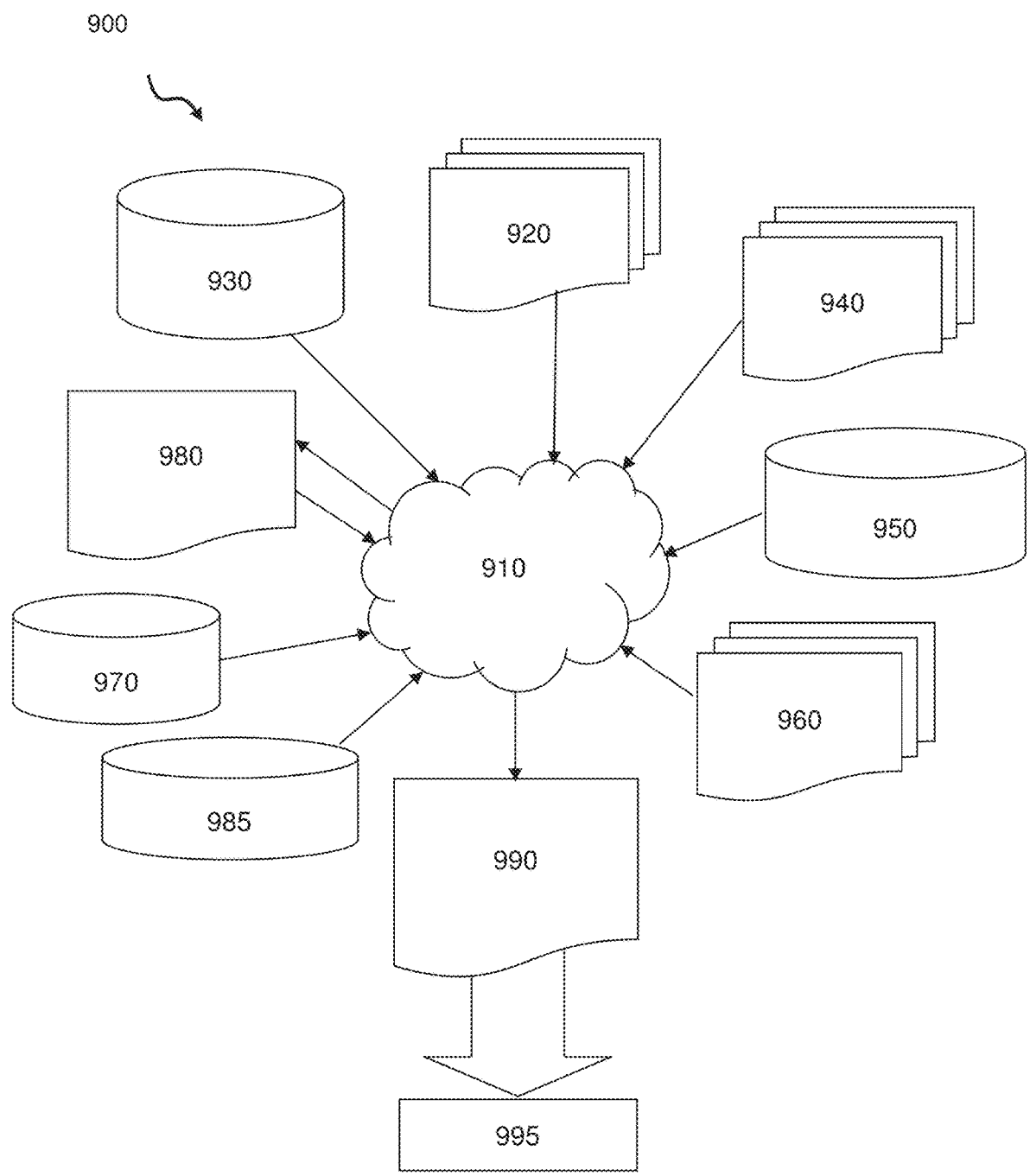
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 1. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 1. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 1 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 1. In one embodiment, design structure 990 may comprise a compiled, executable HDL simulation model that functionally simulates the devices shown in FIG. 1.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 1. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
    charging a boost capacitor and a drive capacitor with a supply voltage;
    providing a boosted voltage of the charged boost capacitor to a FET during a pump phase; and
    providing a turn on voltage from the charged drive capacitor to the FET so that the boosted supply voltage can pass to an output node during the pump phase,
    wherein the FET is gated by an output gate voltage which is charged by a drive-cap precharge circuit.

2. The method of claim 1, wherein the boosted voltage is approximately 2× of the supply voltage.

3. The method of claim 1, wherein the boosted voltage is below a reliability limit of the FET.

4. The method of claim 1, wherein a voltage difference between a source and a drain of the FET is below a reliability limit of the FET.

5. The method of claim 1, wherein the FET is turned off during the pump phase.

6. The method claim 1, wherein the drive capacitor is charged by the drive-cap precharge circuit during a precharge stage.

7. The method of claim 6, wherein the boosted voltage is provided to a node of the FET during the pump phase by opening a plurality of transistors coupled to the FET.

8. The method of claim 7, further comprising tailoring a current during the charge phase and the pump phase with a bias generator to provide a functional transfer of signal XL1 to the drive-cap precharge circuit.

9. The method of claim 1, further comprising supplying a first terminal of the boost capacitor with the supply voltage and turning on a second transistor to provide GND to a second terminal of the boost capacitor.

10. The method of claim 1, further comprising turning on a third transistor during the pump phase to add the supply voltage to the boost capacitor to obtain the boosted voltage.

* * * * *